United States Patent [19]

Yabe et al.

[11] Patent Number: 5,599,394
[45] Date of Patent: Feb. 4, 1997

[54] APPARATUS FOR DELIVERING A SILICA FILM FORMING SOLUTION

[75] Inventors: Manabu Yabe; Masaru Kitagawa; Takafumi Ohki; Mitsuhiro Fujita, all of Kyoto, Japan

[73] Assignee: Dainippon Screen Mfg., Co., Ltd., Kyoto, Japan

[21] Appl. No.: 312,733

[22] Filed: Sep. 27, 1994

[30] Foreign Application Priority Data

Oct. 7, 1993 [JP] Japan ................. 5-059730 U

[51] Int. Cl.⁶ ............................................. B05C 5/00
[52] U.S. Cl. .................... 118/319; 118/688; 118/320; 437/228; 437/231
[58] Field of Search ..................... 118/688, 319, 118/320, 259, 708, 710, 303; 222/52, 148, 334, 108; 417/393, 395; 65/60.1, 60.8; 437/228, 231; 427/240; 141/86

[56] References Cited

U.S. PATENT DOCUMENTS 4,649,856 3/1987 Shannon et al. ................. 118/712
5,134,962 8/1992 Amada et al. .................. 118/688

FOREIGN PATENT DOCUMENTS

| 3037260 | 6/1982 | Germany . |
|---|---|---|
| 60-12175 | 1/1985 | Japan . |
| 3-114565 | 5/1991 | Japan . |
| 4-42909 | 10/1992 | Japan . |
| 5-68095 | 9/1993 | Japan . |
| 781585 | 11/1980 | U.S.S.R. . |

Primary Examiner—Donald E. Czaja
Assistant Examiner—Calvin Padgett
Attorney, Agent, or Firm—Lowe, Price, LeBlanc & Becker

[57] ABSTRACT

A dispensing apparatus for delivering a silica coating solution in a fixed quantity from a liquid container to a surface of a substrate to form a silica film thereon. The liquid container storing the silica coating solution is connected to a diaphragm pump through a suction pipe. The diaphragm pump is connected to a nozzle through a delivery pipe. The coating solution in the liquid container is supplied to the nozzle by sucking and delivering action of the diaphragm pump. The coating solution is discharged from the nozzle to a surface of a substrate supported by a spin chuck of a spin coating apparatus.

6 Claims, 4 Drawing Sheets

APPARATUS FOR DELIVERING A SILICA FILM FORMING SOLUTION

BACKGROUND OF THE INVENTION (1) Field of the Invention

This invention relates to an apparatus for use with a spin coating apparatus for dispensing a coating solution to form silica film on surfaces of substrates such as semiconductor wafers or glass substrates for liquid crystal displays.

(2) Description of the Related Art

A conventional apparatus for dispensing a coating solution is disclosed in Japanese Patent Publication (Examined) No. 1989-52065 (Japanese Patent Publication (Unexamined) No. 1985-12175), for example.

This type of solution dispensing apparatus has a sealed container for storing the coating solution, which is pressurized by introducing nitrogen gas or helium gas thereinto. The coating solution is delivered under pressure from the container through supply piping, to drip onto a substrate surface.

A different type of apparatus employs a bellows pump for delivering a photoresist as a coating solution to drip onto a substrate surface. That is, the bellows pump sucks a coating solution such as a photoresist, and delivers the coating solution for application to a substrate surface.

The known apparatus have various drawbacks as set out hereunder.

The apparatus utilizing gas pressure encounters the following inconvenience when nitrogen gas is used for introduction into the sealed container.

Nitrogen gas is readily soluble in the coating solution. The nitrogen gas dissolved in the coating solution may emerge in bubbles during transmission of the coating solution or may cause degassing after application to a substrate. This results in pinholes appearing in the film formed on the substrate, or in uneven application of the solution, thereby lowering the yield of products.

Where helium gas is used instead of nitrogen gas, the gas is less soluble in the coating solution. However, helium gas is expensive and poses a different problem of high running cost.

The apparatus using a bellows pump and not a gas is free from the problems of gas dissolution in the coating solution and high running cost, but has the following drawback where the coating solution is the type that forms silica film.

The bellows pump sucks and delivers the coating solution with expansion and contraction of the bellows. However, by reason of the pump structure, the coating solution drawn in is not entirely forced out, with a possibility that part of the coating solution remains in the bellows over a long period of time. The coating solution for forming silica film, generally, becomes crystallized with ease. If the coating solution for forming silica film remains in the bellows, crystals of the coating solution will be formed in the bellows. As a result, the bellows pump will deliver the coating solution intermingled with crystals, for application to a substrate surface. When this coating solution forms a film on the surface of a spinning substrate, the crystals will adhere to the substrate surface. This results in uneven application of the solution around the crystals, thereby impairing uniformity of the film formed.

SUMMARY OF THE INVENTION

The present invention has been made having regard to the state of the art noted above, and has for an object to provide an apparatus for dispensing a coating solution to form silica film, which is free from gas dissolution in the coating solution, avoids high running cost, and assures excellent film formation on substrate surfaces though the coating solution for forming silica film tends to crystallize with ease.

The above object is fulfilled, according to the present invention, by a dispensing apparatus for causing a silica coating solution to drip onto a surface of a substrate under horizontal spin coating treatment to form a silica film thereon, the apparatus comprising:

a liquid container for storing the coating solution;

a nozzle opposed to the surface of the substrate for discharging the coating solution;

a diaphragm pump for sucking the coating solution from the liquid container, and delivering the coating solution to the nozzle;

a suction pipe having one end thereof extending into the coating solution stored in the liquid container, and the other end connected to an intake port of the diaphragm pump; and a delivery pipe having one end thereof connected to an outlet port of the diaphragm pump, and the other end connected to the nozzle.

The diaphragm pump may comprise:

a pump chamber having a diaphragm extending therethrough;

a suction valve for opening and closing an intake passage intercommunicating the suction pipe and the pump chamber; and a delivery valve for opening and closing an outlet passage intercommunicating the delivery pipe and the pump chamber.

The apparatus may further comprise:

a pump driving device for reciprocating the diaphragm in the pump chamber;

a suction valve driving device for operating the suction valve;

a delivery valve driving device for operating the delivery valve; and a control device for controlling the pump driving device, suction valve driving device and delivery valve driving device;

whereby the diaphragm pump is driven to suck and deliver the coating solution.

According to this apparatus, in a sucking operation of the diaphragm pump, the silica coating solution is sucked from the liquid container into the diaphragm pump through the suction pipe. Next, in a delivery operation of the diaphragm pump, the silica coating solution sucked into the diaphragm pump is delivered to the nozzle through the delivery pipe, and discharged from the nozzle to the substrate surface.

Since a gas is not used for delivering the coating solution to the substrate surface, there occurs no gas dissolution in the coating solution to cause such inconveniences as gas bubbling during transmission thereof or degassing after application to the substrate surface. This invention does not involve high running cost due to use of an expensive gas. Further, the quantity of silica coating solution applied to the substrate surface may be controlled with high precision, compared with the case of using gas pressure.

In a sucking and delivering operation (one stroke) of the diaphragm pump, almost all of the coating solution sucked is exhausted. The coating solution has a less chance of remaining and crystallizing in the diaphragm pump than in the bellows pump. The silica coating solution supplied to the substrate surface does not contain crystals which would lower film quality. Consequently, a film of excellent quality is formed on the substrate surface.

Preferably, the intake passage and outlet passage intercommunicating the suction pipe and pump chamber, and the pump chamber and outlet passage, respectively, open into peripheral regions of the pump chamber. This arrangement enhances flow of the coating solution through the pump chamber, and diminishes the possibility of the coating solution remaining in the pump chamber.

Preferably, the control device is operable to cause the suction valve driving device and the delivery valve driving device to open the suction valve and close the delivery valve, respectively, and to cause the pump driving device to move the diaphragm from one side wall of the pump chamber where the intake passage and the outlet passage open, to the other side wall, thereby causing the diaphragm pump to suck the coating solution from the liquid container; thereafter to cause the suction valve driving device and the delivery valve driving device to close the suction valve and open the delivery valve, respectively, and to cause the pump driving device to move the diaphragm in an opposite direction from the other side wall to the one side wall, thereby causing the diaphragm pump to deliver the coating solution from the pump chamber to the nozzle and to discharge the coating solution from the nozzle; then to stop the pump driving device for a brief time, with the suction valve remaining closed and the delivery valve remaining open; and subsequently to cause the diaphragm pump to suck the coating solution into the pump chamber.

With this control mode, the diaphragm pump performs a suckback function.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENT

A preferred embodiment of the present invention will be described in detail hereinafter with reference to the drawings.

Figure 1:
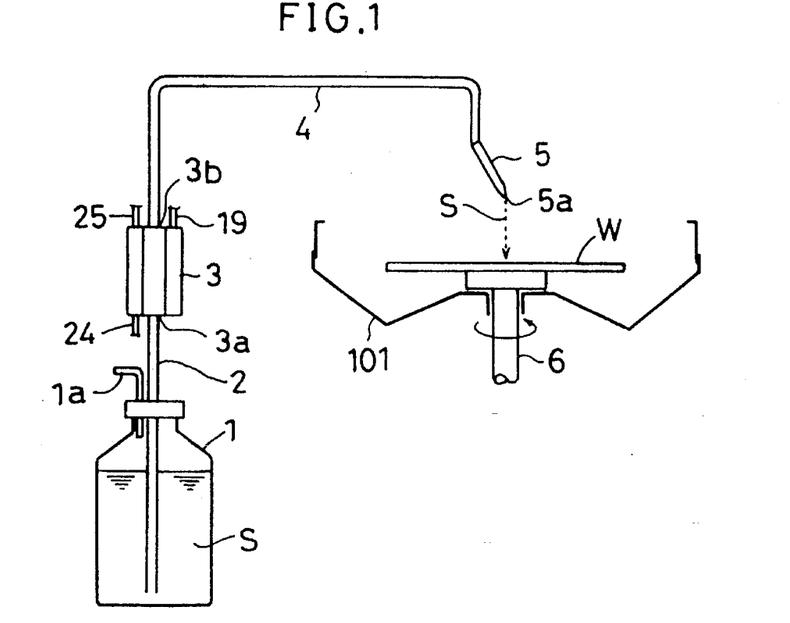
FIG. 1 is a view showing an outline of a spin coating apparatus having an apparatus for dispensing a coating solution to form silica film according to the present invention.
Figure 2:
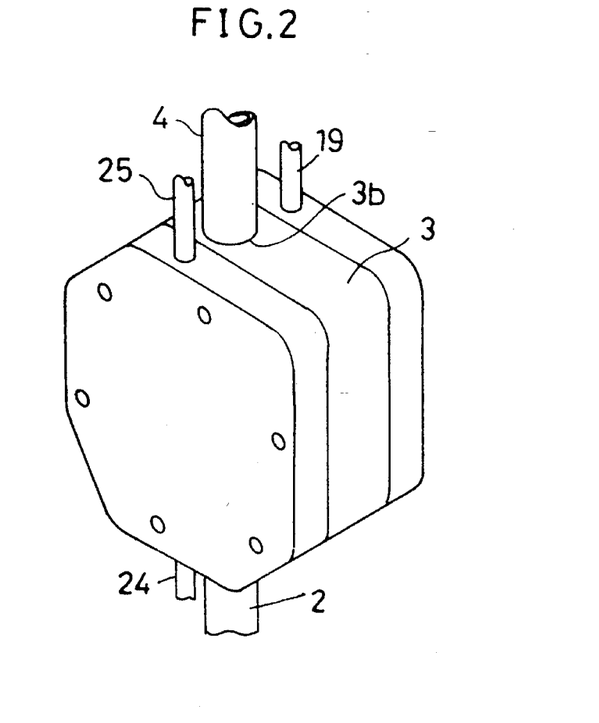
FIG. 2 is a perspective view of a diaphragm pump used in the apparatus according to the present invention.
Figure 3:
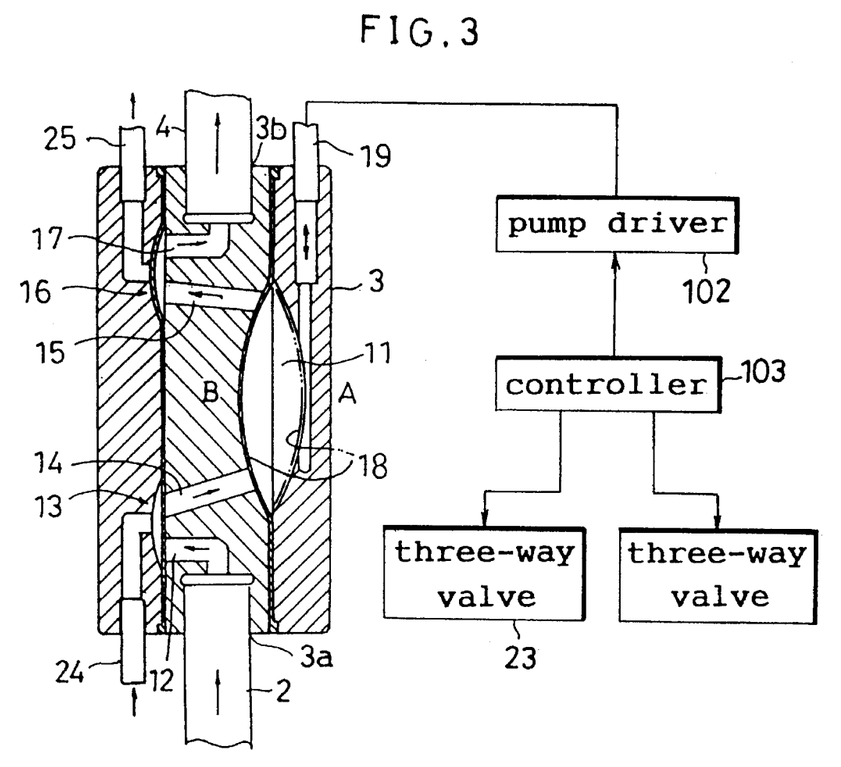
FIG. 3 is a view in vertical section of the diaphragm pump.

FIG. 1 is a view showing an outline of a spin coating apparatus having an apparatus for dispensing a coating solution to form silica film according to the present invention. FIG. 2 is a perspective view of a diaphragm pump used in this apparatus. FIG. 3 is a view in vertical section of the diaphragm pump.

A coating solution to be applied to a surface of a substrate for forming a silica film thereon, in this embodiment, may be a solution of a silicon compound such as silane halide or alkoxy silane dissolved in an organic solvent such as an alcohol or ester, a solution of silica particles dispersed and mixed in an organic solvent, or other such solution. In the following description of the embodiment, such a coating solution for forming silica film is called simply "silica coating solution".

In FIG. 1, numeral 1 denotes a liquid container for storing a silica coating solution S. An end of a suction pipe 2 extends into the silica coating solution S stored in the liquid container 1. The liquid container 1 has a tube 1a for communicating the interior of the container 1 with the ambient.

The other end of the suction pipe 2 is connected to an intake port 3a of a diaphragm pump 3. One end of a delivery pipe 4 is connected to an outlet port 3b of the diaphragm pump 3. The diaphragm pump 3 has a pump driver pipe 19 and valve driver pipes 24 and 25. These pump driver and valve driver pipes 19, 24 and 25 will be described hereinafter.

The other end of the delivery pipe 4 communicates with a nozzle 5. The nozzle 5 has an output end 5a thereof located substantially over the center of a spin chuck 6 for supporting and horizontally spinning a wafer W under treatment. The wafer W is placed on the spin chuck 6, with the center of the wafer W in register with the rotational axis of the spin chuck 6.

In this state, the silica coating solution S is discharged in a predetermined quantity from the output end 5a of the nozzle 5 as described hereinafter. The silica coating solution S discharged drips to an area around the center of the surface of the wafer W. With the spin chuck 6 spinning the wafer W, the centrifugal force thereby generated spreads the dripping silica coating solution S evenly over the surface of the wafer, to form a film of the silica coating solution S having a uniform thickness on the surface of the wafer W.

The spin chuck 6 and wafer W are surrounded by a scatter stopper cup 101 for preventing outward scattering of the silica coating solution S during a spin of the wafer W.

The spin coating apparatus may form a film on the wafer W by one of the following two sequences, for example. In one sequence, the silica coating solution S is caused to drip to the surface of wafer W, and thereafter the wafer W is spun to form a film thereon. In the other sequence, a film is formed by causing the silica coating solution S to drip to the surface of spinning wafer W. Whichever sequence is employed, it is necessary to supply the silica coating solution S in a fixed quantity to the surface of wafer W in order to form a film of uniform thickness. In this embodiment, as described hereinafter, the silica coating solution S is always supplied in a fixed quantity to the surface of wafer W.

Next, a construction of the diaphragm pump 3 used in this embodiment will be described with reference to FIGS. 2 and 3.

As shown in FIG. 3, the intake port 3a (suction pipe 2) and a pump chamber 11 of the diaphragm pump 3 communicate with each other through a first intake passage 12, a suction valve 13 and a second intake passage 14. The pump chamber 11 and the outlet port 3b (delivery pipe 4) communicate with each other through a first outlet passage 15, a delivery valve 16 and a second outlet passage 17.

The pump chamber 11 includes a diaphragm 18 extending therethrough. One end (i.e. the end extending into the diaphragm pump 3) of the pump driver pipe 19 noted hereinbefore communicates with the pump chamber 11, while the other end (i.e. the end extending outwardly from the diaphragm pump 3) thereof is connected to a pump driver 102 such as a piston. The pump driver 102 is operable to decompress and pressurize the pump chamber 11, whereby the diaphragm 18 is forced to reciprocate between side walls (referenced A and B in FIG. 3) of the pump chamber 11 to suck and deliver the silica coating solution S.

The pump driver 102 corresponds to the pump driving device operable under control of a controller 103 acting as the control device. The controller 103 comprises a microcomputer or the like.

Constructions of the suction valve 13 and delivery valve 16 will be described with reference to FIGS. 4A and 4B.

Figures 4A, 4B:
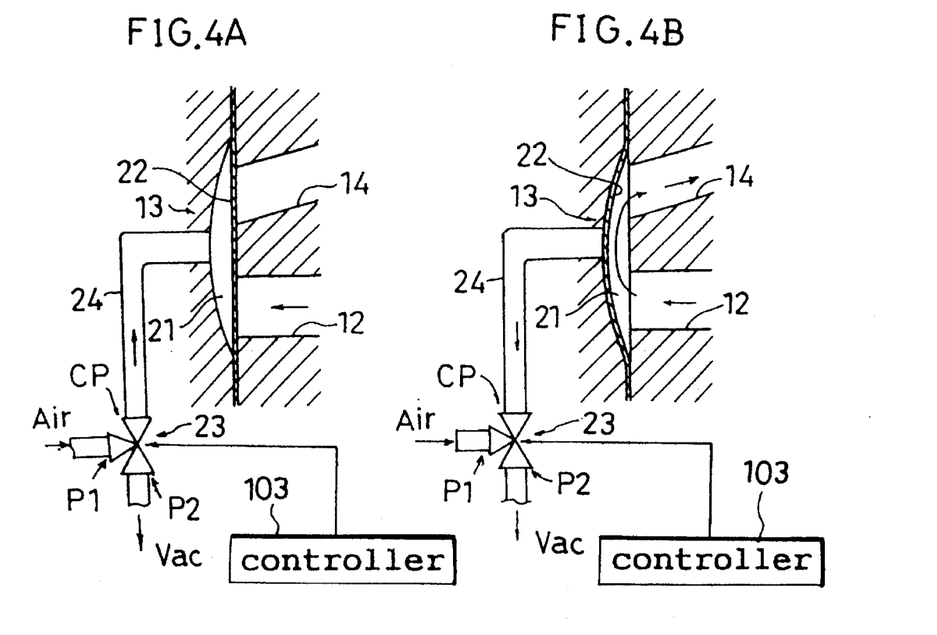
FIGS. 4A and 4B are views showing a valve structure in the diaphragm pump.

The suction valve 13 and delivery valve 16 are similar in construction, and the following description is made taking the suction valve 13 for example, as shown in FIGS. 4A and 4B. FIG. 4A shows the suction valve 13 in a closed position, while FIG. 4B shows the suction valve 13 in an open position.

The suction valve 13 includes a valve chamber 21 having a valve diaphragm 22 deformably extending therethrough. The suction valve 13 is closed when the valve diaphragm 22 shuts the first intake passage 12 and second intake passage 14 (see FIG. 4A). The suction valve 13 is open when the valve diaphragm 22 allows communication between the first intake passage 12 and second intake passage 14 (see FIG. 4B). The suction valve 13 is switchable between the closed position and open position by a three-way valve 23.

One end of the valve driver pipe 24 (or the valve driver pipe 25 for the delivery valve 16) noted hereinbefore communicates with the valve chamber 21, while the other end thereof is connected to a common port CP of the three-way valve 23. The three-way valve 23 includes a first switch port P1 for constantly receiving air supply (for pressurization), and a second switch port P2 through which air is constantly withdrawn (for decompression). When the switch ports P1 and P2 are switched to place the switch port P1 in communication with the common port CP, for example, air is supplied to the valve chamber 21 whereby the valve diaphragm 22 shuts the first intake passage 12 and second intake passage 14 to establish the closed position as shown in FIG. 4A. When the switch port P2 is placed in communication with the common port CP, the valve chamber 21 is decompressed with the air withdrawn therefrom, whereby the valve diaphragm 22 is drawn to the valve driving pipe 24 as shown in FIG. 4B. The suction valve 13 is in the open position now, allowing communication between the first intake passage 12 and second intake passage 14.

The three-way valve 23 for opening and closing the suction valve 13 corresponds to the suction valve driving device according to the present invention. A three-way valve for opening and closing the delivery valve 16 corresponds to the delivery valve driving device according to the present invention. Each of these three-way valves is switchable by the controller 103 which also controls the pump driver 102.

Operations of the diaphragm pump 3 to suck and deliver the silica coating solution S will be described next.

In a sucking operation of the diaphragm pump 3, the suction valve 13 is opened, the delivery valve 16 is closed, and the pump chamber 11 is decompressed to draw the diaphragm 18 to the wall A as shown in a two-dot-and-dash line in FIG. 3 (from the wall B where the second intake passage 14 and first outlet passage 15 open into the pump chamber 11). As a result, the silica coating solution S is sucked from the liquid container 1 into the pump chamber 11 through the suction pipe 2, first intake passage 12, suction valve 13 (in the open position) and second intake passage 14. At this time, the delivery valve 16 in the closed position stops the silica coating solution S flowing backward from the delivery pipe 4.

In a delivery operation of the diaphragm pump 3, the suction valve 13 is closed, the delivery valve 16 is opened, and the pump chamber 11 is pressurized to push the diaphragm 18 to the wall B as shown in a solid line (from the wall A), i.e. in the direction reversed from the sucking operation. As a result, the silica coating solution S sucked into the pump chamber 11 is delivered to the nozzle 5 through the first outlet passage 15, delivery valve 16 (in the open position), second outlet passage 17 and delivery pipe 4. The silica coating solution S supplied to the nozzle 5 is discharged to the surface of wafer W. At this time, the suction valve 13 in the closed position stops the silica coating solution S flowing backward toward the suction pipe 2.

The diaphragm pump 3 is constructed such that, in one suction and delivery cycle (one stroke) described above, the silica coating solution S is dispensed from the nozzle 5 to the surface of wafer W in a quantity needed to form a film thereon.

As noted hereinbefore, the liquid container 1 has the tube 1a for communicating its interior with the ambient. This prevents the interior of the container 1 from becoming decompressed when the silica coating solution S is sucked by the diaphragm pump 3 through the suction pipe 2. Consequently, the diaphragm pump 3 always sucks the same fixed quantity of silica coating solution S in one sucking operation.

The above embodiment provides the following advantages by delivering the silica coating solution S stored in the liquid container 1 to the surface of wafer W.

Firstly, since a gas is not used for delivering the silica coating solution S stored in the liquid container 1 to the surface of wafer W, there occurs no gas dissolution in the silica coating solution S to cause gas bubbling during transmission thereof or degassing after application to the surface of wafer W. Thus, this embodiment eliminates the disadvantages such as formation of pinholes and uneven application of the solution due to the above phenomena.

Where the coating solution is transmitted under gas pressure from the liquid container to the nozzle for application to the surface of wafer W, an arrangement of supply piping from the liquid container to the nozzle may impair the precision of control for dispensing the coating solution in a predetermined quantity to the surface of wafer W. If, for example, the supply piping includes a sharp bend between the liquid container and nozzle, that portion tends to retard flow of the coating solution. Then, even if the coating solution is transmitted under the same gas pressure, the coating solution will not be dispensed in a predetermined quantity to the surface of wafer W.

By contrast, use of the diaphragm pump 3 realizes improved precision in controlling delivery of the coating solution. The diaphragm pump 3 always sucks and delivers a predetermined quantity of coating solution regardless of a piping arrangement. Consequently, the surface of wafer W always receives the predetermined quantity of coating solution.

If a bellows pump were used to suck and deliver the silica coating solution S, the silica coating solution S would remain in the bellows over a long period of time. The bellows contracts to deliver the silica coating solution S sucked by the bellows pump. A space is formed in the bellows even in time of maximum contraction thereof, and part of the silica coating solution S sucked will remain in that space. The residual part of the silica coating solution S remains undelivered in subsequent sucking and delivering cycles. As a result, that part of the silica coating solution S lingers in the bellows over a long period.

With the diaphragm pump 3, the diaphragm 18 moves into tight contact with (or close to) the outlet passage (first outlet passage 15 in the above embodiment) when forcing out the silica coating solution S. Consequently, almost all of the silica coating solution S sucked is exhausted from the pump chamber 11, with no (or only little) space left in the pump chamber 11. Thus, the silica coating solution S hardly crystallizes in the pump chamber 11, thereby minimizing the chance of the silica coating solution S intermingled with crystals being applied to the surface of wafer W. A film of excellent quality is thereby formed on the surface of wafer W, without being impaired by crystals mixed into the silica coating solution S.

Experiment has been conducted on the film formed on the surface of wafer W, using the above embodiment, under the conditions set out below, which has produced excellent results as also set out below:

Experiment Conditions (1) The diaphragm pump 3 was set to a diaphragm pressure at 0.1 Kg/cm$^2$.

(2) The silica coating solution S was applied to the surfaces of wafers W having a 6-inch diameter at the rate of 1 to 2 cc per wafer.

Results

The films formed had a substantially uniform thickness without variations due to bubbling or crystallization. When the silica coating solution S was delivered under pressure of nitrogen gas, bubbles of nitrogen gas dissolved in the silica coating solution S were visually observed inside the supply piping. On the other hand, when the silica coating solution S was delivered according to this embodiment, no gas bubbles were seen in the silica coating solution S inside the supply piping (suction pipe 2 and delivery pipe 4).

Figure 5A:
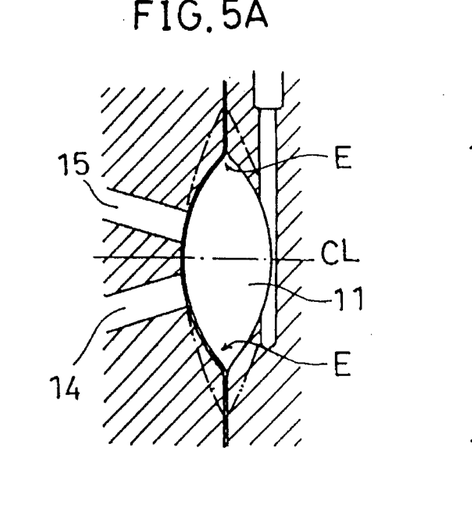
FIGS. 5A and 5B are explanatory views of an improved diaphragm pump.
Figure 5B:
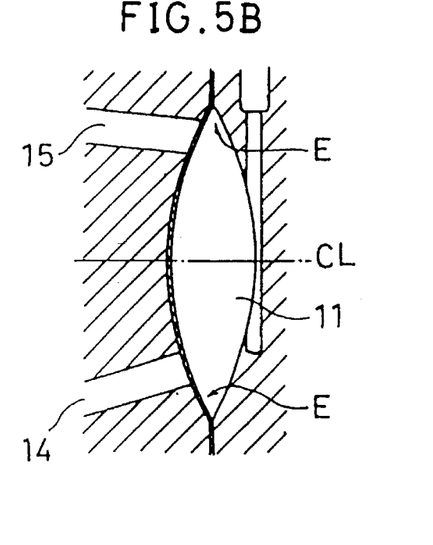

A conventional diaphragm pump often defines a pump chamber 11 having inner walls of large curvature (a large width across a middle position with respect to the diaphragm extending direction) as shown in FIG. 5A. The second intake passage 14 and first outlet passage 15 open into the pump chamber 11 adjacent a centerline CL thereof. All this is designed to achieve a high feeding efficiency. With this construction, the solution tends to stagnate in peripheral regions E of the pump chamber 11. Consequently, the solution could remain, though in a small quantity, in the pump chamber 11. It is desirable to construct the diaphragm pump 3 as shown in FIG. 5B, in which the peripheral regions E of the pump chamber 11 have a smooth configuration following two-dot-and-dash lines in FIG. 5A (with a reduced width across the middle position with respect to the diaphragm extending direction), and the second intake passage 14 and first outlet passage 15 open into the pump chamber 11 adjacent the peripheral regions E. The diaphragm pump having the above construction, as used in this embodiment, promotes flow through the pump chamber 11 of the silica coating solution S and, compared with the conventional diaphragm pump (FIG. 5A), diminishes the possibility of the silica coating solution S remaining in the pump chamber 11. It will be appreciated that, even if the second intake passage 14 and first outlet passage 15 are located close to the peripheral regions E of the pump chamber 11 shown in FIG. 5B, the solution will not remain in the central region (adjacent the centerline CL) where the diaphragm 18 moves through a wide range to assure high flowability of the solution.

Further, this type of coating solution dispensing apparatus usually has a suckback mechanism to prevent spilling of the coating solution after dispensation. It is known that a film of uniform thickness is impossible if the coating solution inadvertently drips (i.e. spills) from the nozzle 5 when the wafer W is spinning to spread the coating solution applied in a predetermined quantity to the surface thereof. Thus, the suckback mechanism is provided to draw the coating solution back from the nozzle after the solution is applied in the predetermined quantity to the wafer. However, the special suckback mechanism added exclusively to each apparatus in order to prevent spilling of the coating solution would result in a complicated construction and high cost.

In this embodiment, a suckback function is provided for the diaphragm pump 3, which is realized by controlling timing of the sucking and delivering action of the diaphragm 18 and operation of the suction valve 13 and delivery valve 16 as follows.

This control will be described with reference to FIG. 6.

Figure 6:
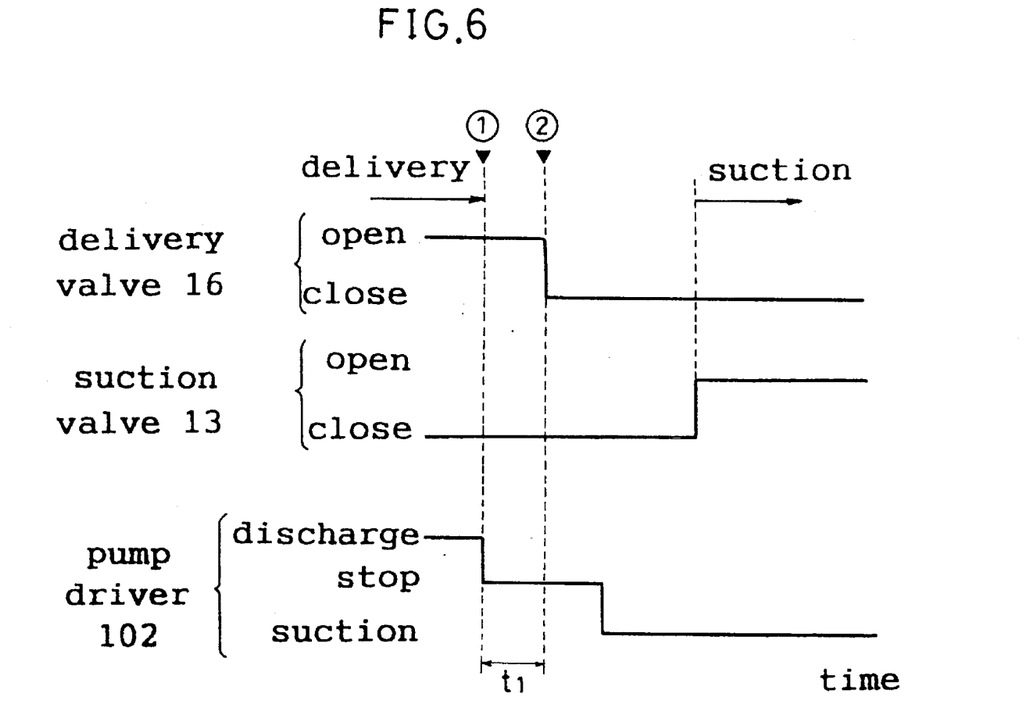
FIG. 6 is a time chart illustrating suckback action of the diaphragm pump.

FIG. 6 is a time chart illustrating the control of suckback action of the diaphragm pump 3.

In FIG. 6, numeral 1 in a circle denotes a point of time at which delivery by the diaphragm 18 is completed, i.e. when the diaphragm 18 reaches to the solid line position (on or adjacent wall B) in FIG. 3. At this time, the delivery valve 16 is open and the suction valve 13 closed. The pump driver 102 is stopped for a brief time prior to a next suction cycle, during which the pump chamber 11 is neither pressurized nor decompressed ("stop" of the pump driver 102 in FIG. 6). The delivery valve 16 is not closed at point of time "1", but is closed upon lapse of time t1, i.e. at point of time "2". With this control, the coating solution has been discharged in the predetermined quantity from the nozzle 5 upon completion of delivery (by point of time "1"). Thereafter the diaphragm 18, with no pressure applied from the pump driver 102, slightly moves back toward wall A in reaction to the forced movement toward wall B in FIG. 3. Since the delivery valve 16 remains open at this time, a small quantity of the coating solution is drawn backward from the nozzle 5 through the delivery pipe 4.

If time t1 is set to 0.1 sec in operating the apparatus, the diaphragm pump 3 performs an excellent suckback function.

Figure 7A:
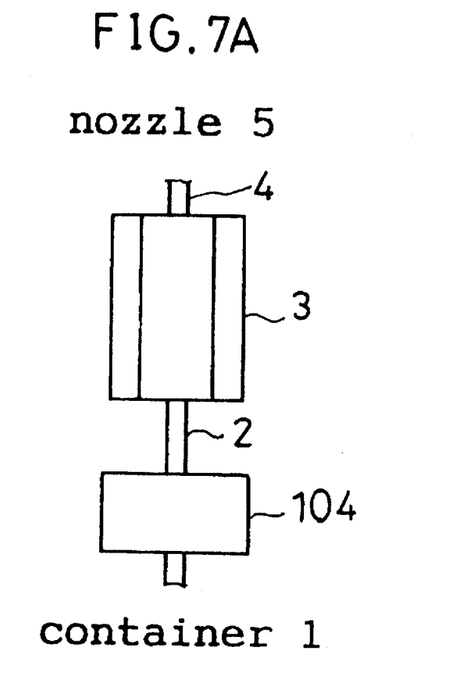
FIGS. 7A, 7B and 7C are schematic views showing modifications of the apparatus according to this invention.

In the above embodiment, as shown in FIG. 7A, a filter 104 may be mounted in the passage of the silica coating solution S through the suction pipe 2 between the liquid container 1 and diaphragm pump 3. The filter 104 will remove any foreign matters (contaminants) from the silica coating solution S sucked from the liquid container 1, upstream of the delivery line through the diaphragm pump 3, delivery pipe 4 and nozzle 5 to the surface of wafer W, thereby to enhance film quality.

Figure 7B:
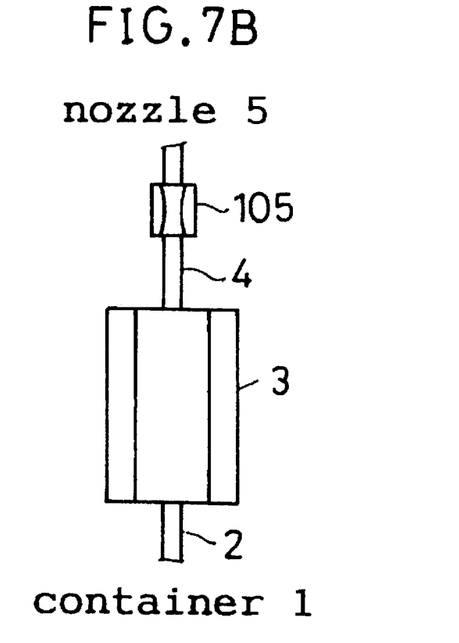

As shown in FIG. 7B, a flow rate control needle valve 105 or the like may be mounted between the diaphragm pump 3 and nozzle 5 to effect fine adjustment of the quantity of coating solution for delivery.

Figure 7C:
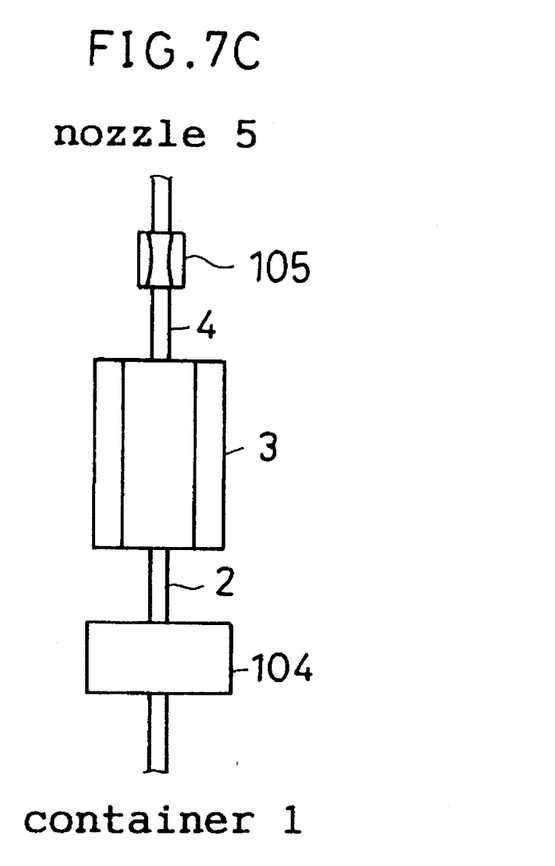

Further, as shown in FIG. 7C, both the filter 104 and flow rate control needle valve 105 may be mounted in the passage of the silica coating solution S through the suction pipe 2 and between the diaphragm pump 3 and nozzle 5, respectively.

The present invention may be embodied in other specific forms without departing from the spirit or essential attributes thereof and, accordingly, reference should be made to the appended claims, rather than to the foregoing specification, as indicating the scope of the invention.

What is claimed is:

1. A dispensing apparatus for causing a silica coating solution to drip onto a surface of a substrate under horizontal spin coating treatment to form a silica film thereon, said apparatus comprising:

a liquid container for storing said coating solution;

a nozzle opposed to said surface of said substrate for discharging said coating solution;

a diaphragm pump for sucking said coating solution from said liquid container, and delivering said coating solution to said nozzle, said diaphragm pump including:

an intake port for receiving said coating solution;

an outlet port for delivering said coating solution;

a pump chamber having a diaphragm extending therethrough;

an intake passage intercommunicating said intake port and said pump chamber, one end of said intake passage communicating with said pump chamber adjacent a first position thereof for supporting said diaphragm, and the other end of said intake passage communicating with said intake port;

a suction valve for opening and closing said intake passage;

an outlet passage intercommunicating said outlet port and said pump chamber, one end of said outlet passage communicating with said pump chamber adjacent a second position thereof for supporting said diaphragm, and the other end of said outlet passage communicating with said outlet port; and a delivery valve for opening and closing said outlet passage;

a suction pipe having one end thereof extending into said coating solution stored in said liquid container, and the other end connected to an intake port;

a delivery pipe having one end thereof connected to said outlet port, and the other end connected to said nozzle;

pump driver means for reciprocating said diaphragm in said pump chamber;

suction valve driver means for operating said suction valve;

delivery valve driver means for operating said delivery valve; and control means for controlling said pump driver means, said suction valve driver means and said delivery valve driver means.

2. A dispensing apparatus as defined in claim 1, wherein said control means is operable to cause said suction valve driver means and said delivery valve driver means to open said suction valve and close said delivery valve, respectively, and to cause said pump driver means to move said diaphragm from one side wall of said pump chamber where said intake passage and said outlet passage open, to the other side wall, thereby causing said diaphragm pump to suck said coating solution from said liquid container; thereafter to cause said suction valve driver means and said delivery valve driver means to close said suction valve and open said delivery valve, respectively, and to cause said pump driver means to move said diaphragm in an opposite direction from said other side wall to said one side wall, thereby causing said diaphragm pump to deliver said coating solution from said pump chamber to said nozzle and to discharge said coating solution from said nozzle; then to stop said pump driver means for a brief time, with said suction valve remaining closed and said delivery valve remaining open; and subsequently to cause said diaphragm pump to suck said coating solution into said pump chamber.

3. A dispensing apparatus for causing a silica coating solution to drip onto a surface of a substrate under horizontal spin coating treatment to form a silica film thereon, said apparatus comprising:

(a) a liquid container for storing said coating solution;

(b) a nozzle opposed to said surface of said substrate for discharging said coating solution;

(c) a diaphragm pump for sucking said coating solution from said liquid container, and delivering said coating solution to said nozzle;

(d) a suction pipe having one end thereof extending into said coating solution stored in said liquid container, and the other end connected to an intake port of said diaphragm pump; and (e) a delivery pipe having one end thereof connected to an outlet port of said diaphragm pump, and the other end connected to said nozzle;

wherein said diaphragm pump comprises:

(c-1) a pump chamber having a diaphragm extending therethrough;

(c-2) a suction valve for opening and closing an intake passage intercommunicating said suction pipe and said pump chamber; and (c-3) a delivery valve for opening and closing an outlet passage intercommunicating said delivery pipe and said pump chamber;

said apparatus further comprising:

(f) pump driver means for reciprocating said diaphragm in said pump chamber;

(g) suction valve driver means for operating said suction valve;

(h) delivery valve driver means for operating said delivery valve; and (i) control means for controlling said pump driver means, said suction valve driver means and said delivery valve driver means;

whereby said diaphragm pump is driven to suck and deliver said coating solution;

wherein said suction valve comprises:

(c-2-1) a first valve chamber disposed in said intake passage; and (c-2-2) a first valve diaphragm extending through said valve chamber;

said suction valve being operable to open and close said intake passage, with said first valve diaphragm deformable between a position to intercommunicate and a position to close a first portion of said intake passage extending from said suction pipe to said first valve chamber and a second portion of said intake passage extending from said first valve chamber to said pump chamber; and wherein said delivery valve comprises:

(c-3-1) a second valve chamber disposed in said outlet passage; and (c-3-2) a second valve diaphragm extending through said second valve chamber;

said delivery valve being operable to open and close said outlet passage, with said second valve diaphragm deformable between a position to intercommunicate and a position to close a first portion of said outlet passage extending from said pump chamber to said second valve chamber and a second portion of said outlet passage extending from said second valve chamber to said delivery pipe.

4. A dispensing apparatus for causing a silica coating solution to drip onto a surface of a substrate under horizontal spin coating treatment to form a silica film thereon, said apparatus comprising:

(a) a liquid container for storing said coating solution;

(b) a nozzle opposed to said surface of said substrate for discharging said coating solution;

(c) a diaphragm pump for sucking said coating solution from said liquid container, and delivering said coating solution to said nozzle;

(d) a suction pipe having one end thereof extending into said coating solution stored in said liquid container, and the other end connected to an intake port of said diaphragm pump; and (e) a delivery pipe having one end thereof connected to an outlet port of said diaphragm pump, and the other end connected to said nozzle;

wherein said diaphragm pump comprises:
(c-1) a pump chamber having a diaphragm extending therethrough;
(c-2) a suction valve for opening and closing an intake passage intercommunicating said suction pipe and said pump chamber; and
(c-3) a delivery valve for opening and closing an outlet passage intercommunicating said delivery pipe and said pump chamber;

said apparatus further comprising:

(f) pump driver means for reciprocating said diaphragm in said pump chamber;

(g) suction valve driver means for operating said suction valve;

(h) delivery valve driver means for operating said delivery valve; and (i) control means for controlling said pump driver means, said suction valve driver means and said delivery valve driver means;

whereby said diaphragm pump is driven to suck and deliver said coating solution; and wherein said control means is operable to cause said suction valve driver means and said delivery valve driver means to open said suction valve and close said delivery valve, respectively and to cause said pump driver means to move said diaphragm from one side wall of said pump chamber where said intake passage and said outlet passage open, to the other side wall, thereby causing said diaphragm pump to suck said coating solution from said liquid container; thereafter to cause said suction valve driver means and said delivery valve driver means to close said suction valve and open said delivery valve, respectively, and to cause said pump driver means to move said diaphragm in an opposite direction from said other side wall to said one side wall, thereby causing said diaphragm pump to deliver said coating solution from said pump chamber to said nozzle and to discharge said coating solution from said nozzle; then to stop said pump driver means for a brief time, with said suction valve remaining closed and said delivery valve remaining open; and subsequently to cause said diaphragm pump to suck said coating solution into said pump chamber.

5. A dispensing apparatus for causing a silica coating solution to drip onto a surface of a substrate under horizontal spin coating treatment to form a silica film thereon, said apparatus comprising:

a liquid container for storing said coating solution;

a nozzle opposed to said surface of said substrate for discharging said coating solution;

a diaphragm pump for sucking said coating solution from said liquid container, and delivering said coating solution to said nozzle;

a suction pipe having one end thereof extending into said coating solution stored in said liquid container, and the other end connected to an intake port of said diaphragm pump;

a delivery pipe having one end thereof connected to an outlet port of said diaphragm pump, and the other end connected to said nozzle; and a filter mounted on said suction pipe.

6. A dispensing apparatus for causing a silica coating solution to drip onto a surface of a substrate under horizontal spin coating treatment to form a silica film thereon, said apparatus comprising:

a liquid container for storing said coating solution;

a nozzle opposed to said surface of said substrate for discharging said coating solution;

a diaphragm pump for sucking said coating solution from said liquid container, and delivering said coating solution to said nozzle;

a suction pipe having one end thereof extending into said coating solution stored in said liquid container, and the other end connected to an intake port of said diaphragm pump;

a delivery pipe having one end thereof connected to an outlet port of said diaphragm pump, and the other end connected to said nozzle; and a flow rate control needle valve mounted on said delivery pipe.

* * * * *